(12) United States Patent
Son et al.

(10) Patent No.: US 12,366,239 B2
(45) Date of Patent: Jul. 22, 2025

(54) PUMP, APPARATUS FOR SUPPLYING CHEMICAL LIQUID AND APPARATUS FOR PROCESSING SUBSTRATE

(71) Applicant: SEMES CO., LTD., Chungcheongnam-do (KR)

(72) Inventors: Young Jun Son, Chungcheongnam-do (KR); Woo Sin Jung, Chungcheongnam-do (KR); Woo Ram Lee, Chungcheongnam-do (KR); Byoung Doo Choi, Chungcheongnam-do (KR); Sung Chul Jung, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 266 days.

(21) Appl. No.: 18/105,878

(22) Filed: Feb. 5, 2023

(65) Prior Publication Data
US 2023/0313791 A1    Oct. 5, 2023

(30) Foreign Application Priority Data
Apr. 5, 2022 (KR) .................. 10-2022-0041968

(51) Int. Cl.
| | | |
|---|---|---|
| *F04B 43/10* | (2006.01) | |
| *B05B 9/04* | (2006.01) | |
| *F04B 43/00* | (2006.01) | |

(52) U.S. Cl.
CPC ............ *F04B 43/10* (2013.01); *B05B 9/0406* (2013.01); *F04B 43/0072* (2013.01)

(58) Field of Classification Search
CPC .... F04B 43/0072; F04B 43/10; F04B 43/113; F04B 49/08; F04B 53/16; F04B 49/007;
(Continued)

(56) References Cited

U.S. PATENT DOCUMENTS 3,136,257 A * 6/1964 Smith ................... F04B 53/123
                                                          417/241
10,790,165 B2 * 9/2020 Kashiyama ............. F04B 13/00
(Continued)

FOREIGN PATENT DOCUMENTS

| JP | 3559632 | 9/2004 |
|---|---|---|
| JP | 2013-36396 | 2/2013 |

(Continued)

OTHER PUBLICATIONS

Office Action dated Nov. 21, 2023 for Korean Patent Application No. 10-2022-0041968 and its English translation from Global Dossier.

*Primary Examiner* — Dominick L Plakkoottam
(74) *Attorney, Agent, or Firm* — WOMBLE BOND DICKINSON (US) LLP

(57) ABSTRACT

Provided are a pump, an apparatus for supplying a chemical liquid and an apparatus for processing a substrate. The pump includes a tube having elasticity and having a flow path through which a chemical liquid flows in; and a case having an internal space partitioned into at least two chambers through which gas is supplied or discharged, where the at least two chambers cover an outer circumference of the tube. Using the pump, the apparatus for supplying a chemical liquid and the apparatus for processing a substrate, by an operation in which gas is supplied or discharged into each partitioned chamber in the case, by applying or releasing pressure to the outer circumference of each corresponding tube independently without interfering between the internal pressures between the chambers, efficient pumping operation of the pump may be obtained, and precise control of the discharge pressure of the liquid may be implemented.

17 Claims, 9 Drawing Sheets

(58) Field of Classification Search
CPC ..... F04B 53/20; B05B 9/0406; B05B 9/0409; H01L 21/67017; H01L 21/6715; C23C 14/22; C23C 16/44; F05B 2210/11
See application file for complete search history.

(56) References Cited

U.S. PATENT DOCUMENTS

| | | | | |
|---|---|---|---|---|
| 2007/0031273 | A1* | 2/2007 | Yajima | F04B 43/10 417/478 |
| 2016/0115952 | A1* | 4/2016 | Sasa | F04B 43/0072 417/472 |
| 2016/0375459 | A1* | 12/2016 | deVilliers | F04B 13/00 700/231 |
| 2020/0018303 | A1* | 1/2020 | Hirata | F04B 43/0054 |
| 2022/0331833 | A1* | 10/2022 | Yajima | G03F 7/162 |

FOREIGN PATENT DOCUMENTS

| | | | |
|---|---|---|---|
| JP | 2013036396 A | * | 2/2013 |
| KR | 10-2016-0047997 | | 5/2016 |

* cited by examiner

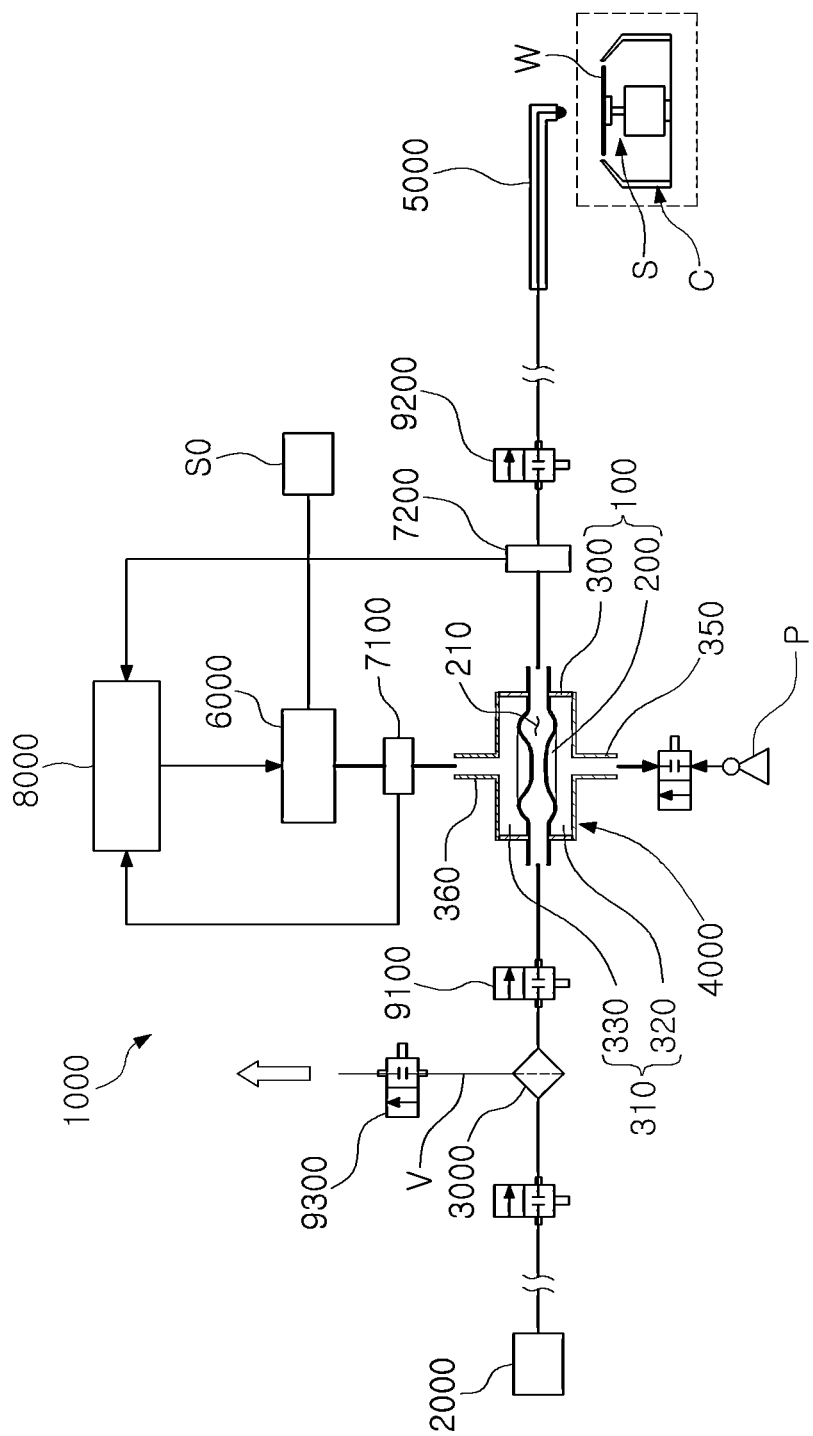
[FIG. 1]

[FIG. 2]
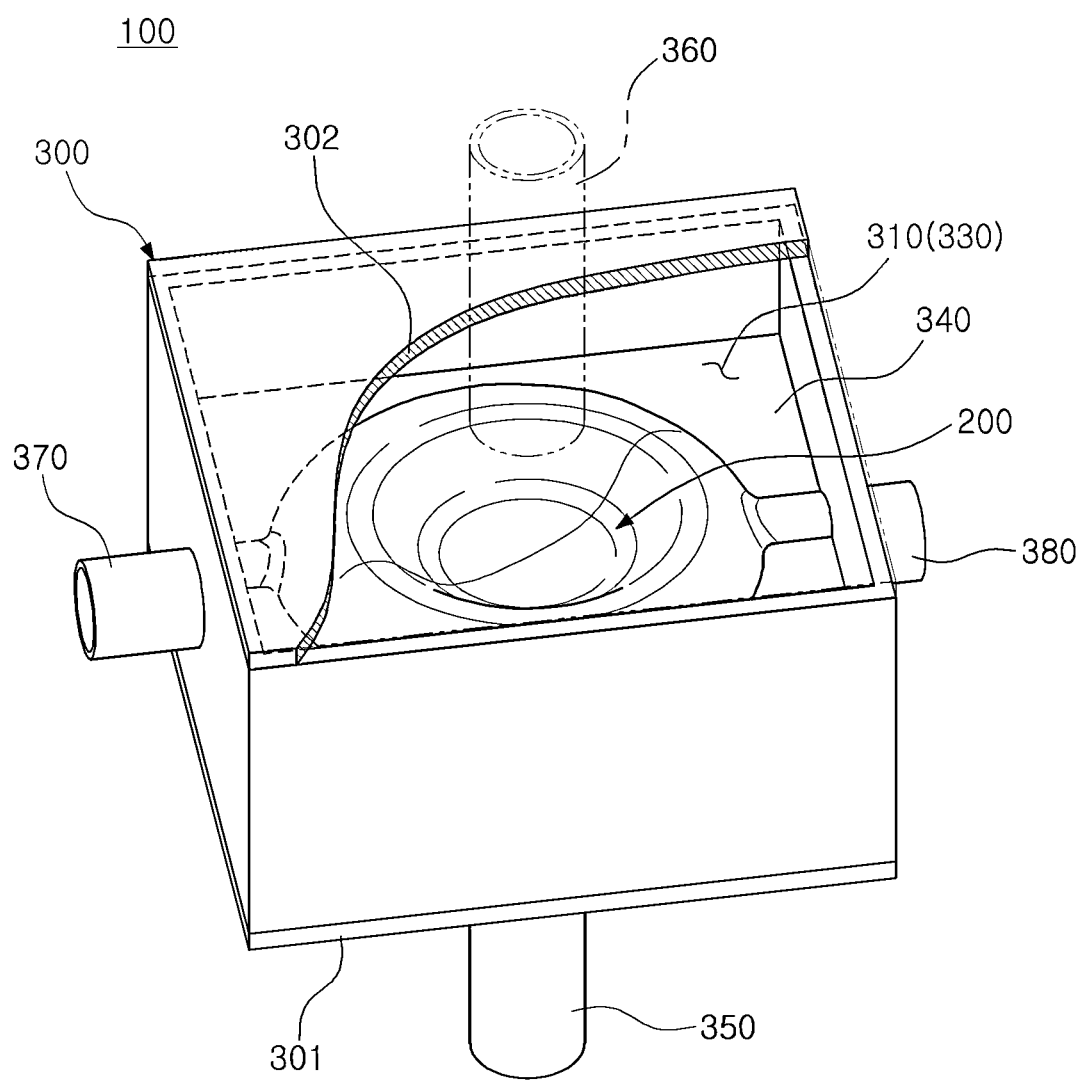

[FIG. 3]
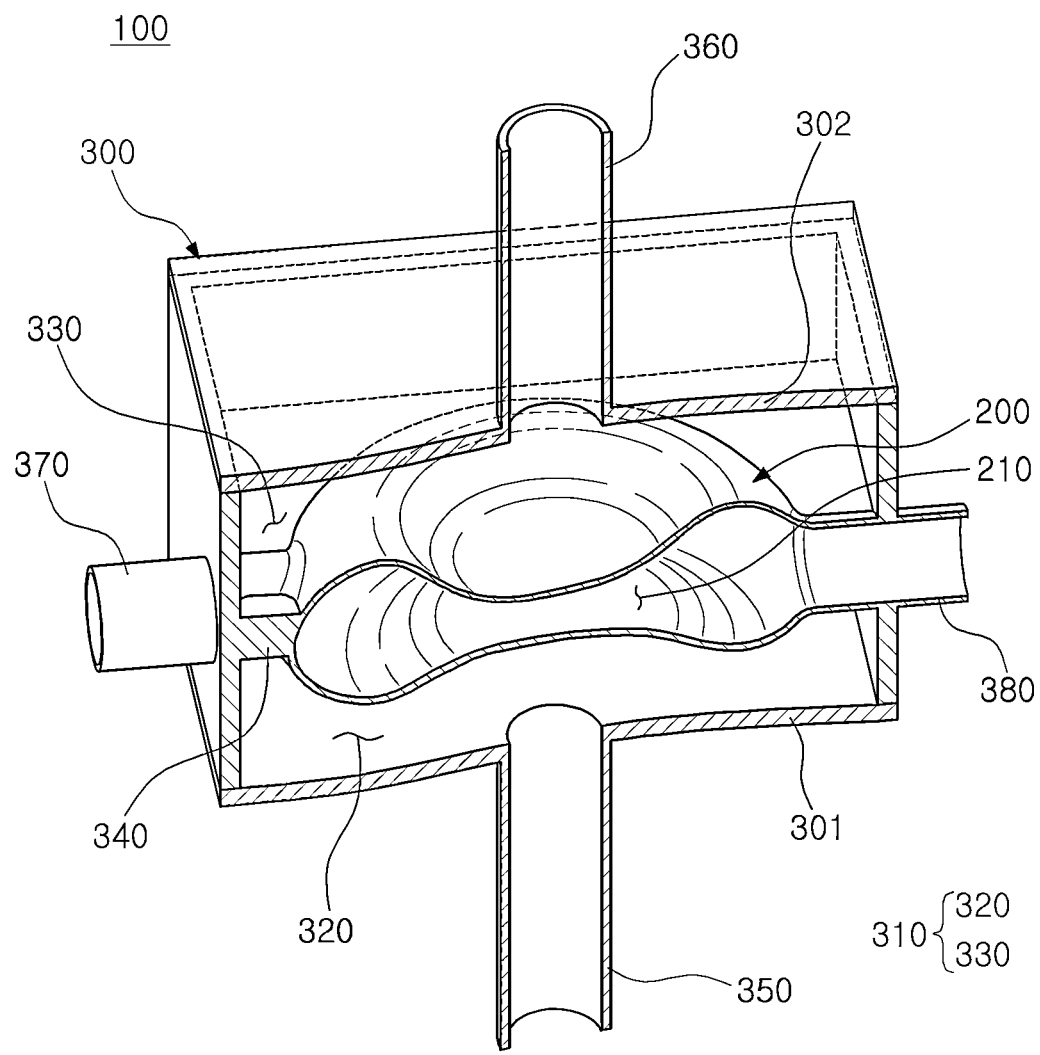

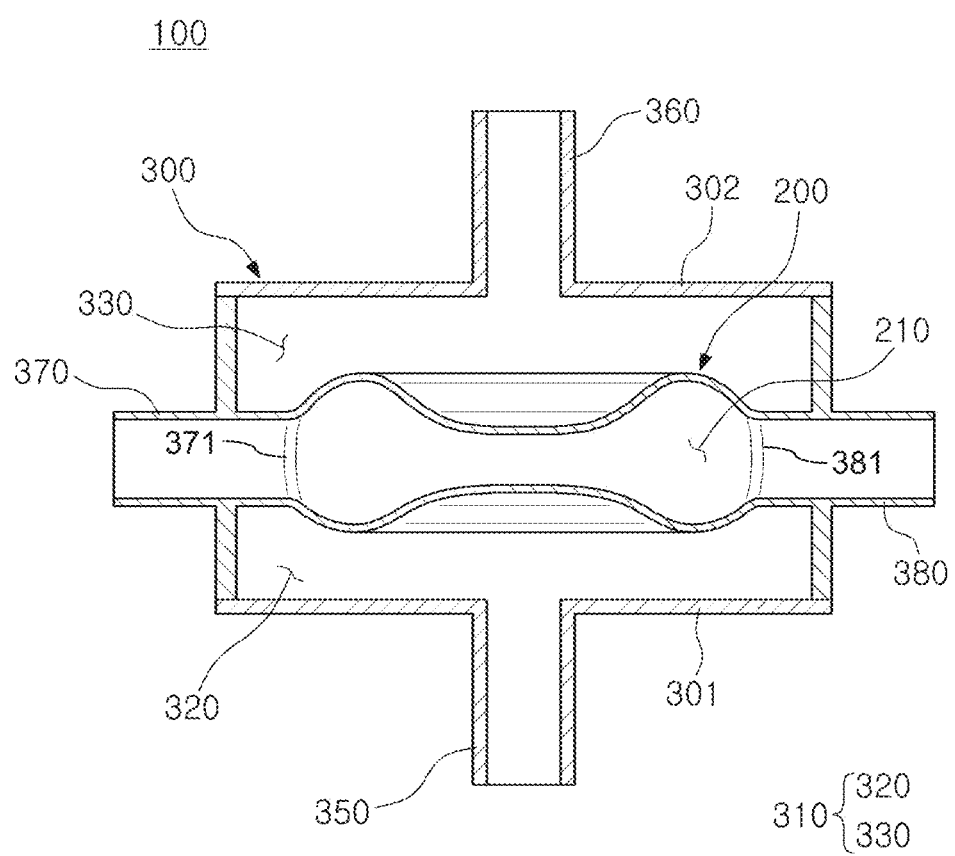
[FIG. 4]

[FIG. 5]
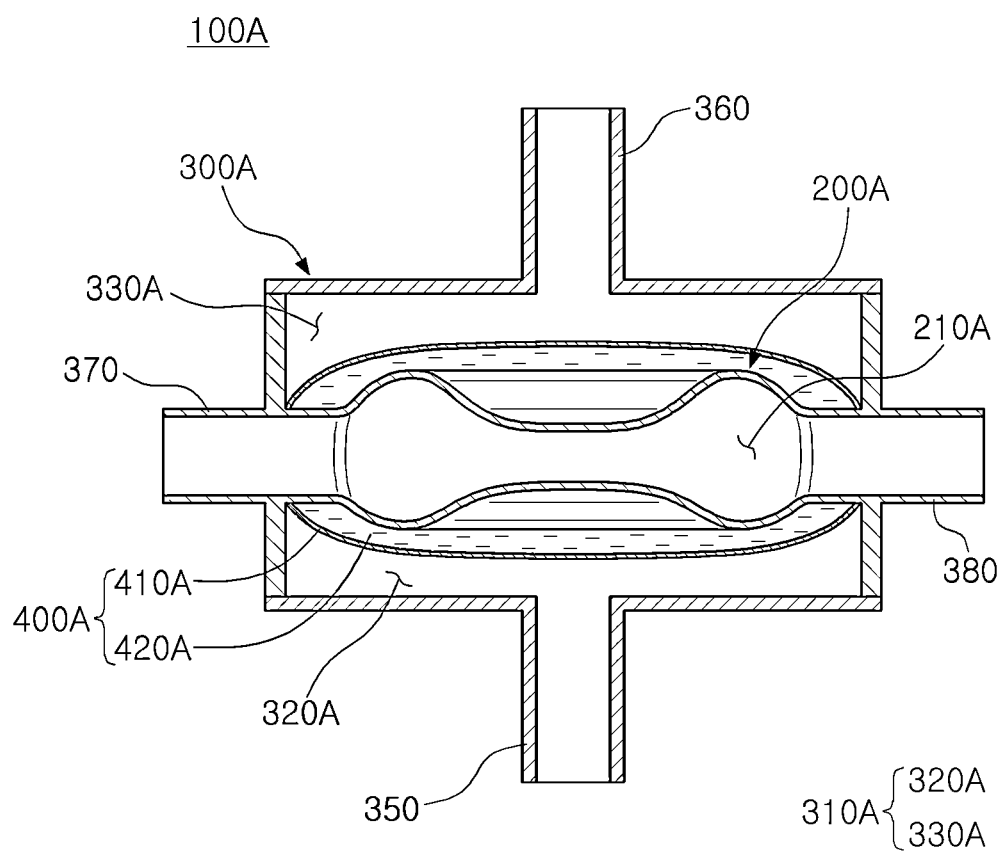

[FIG. 6]
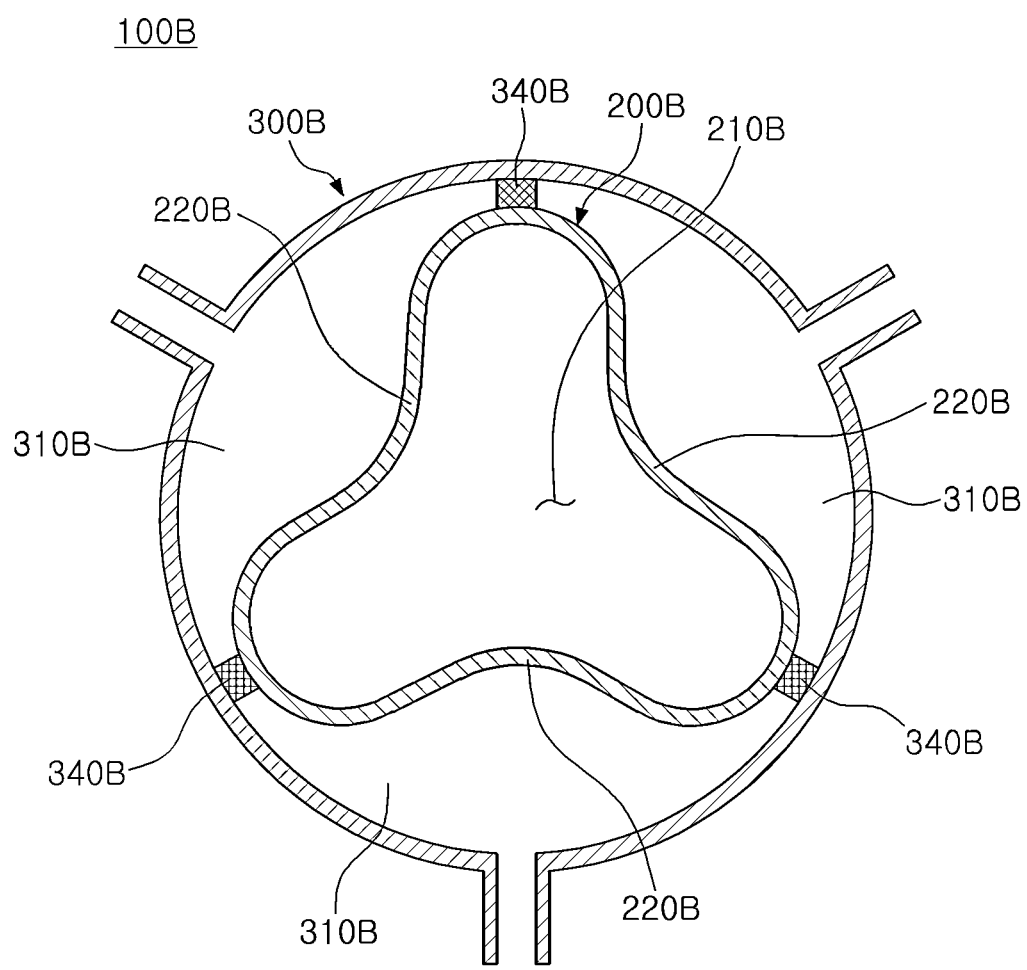

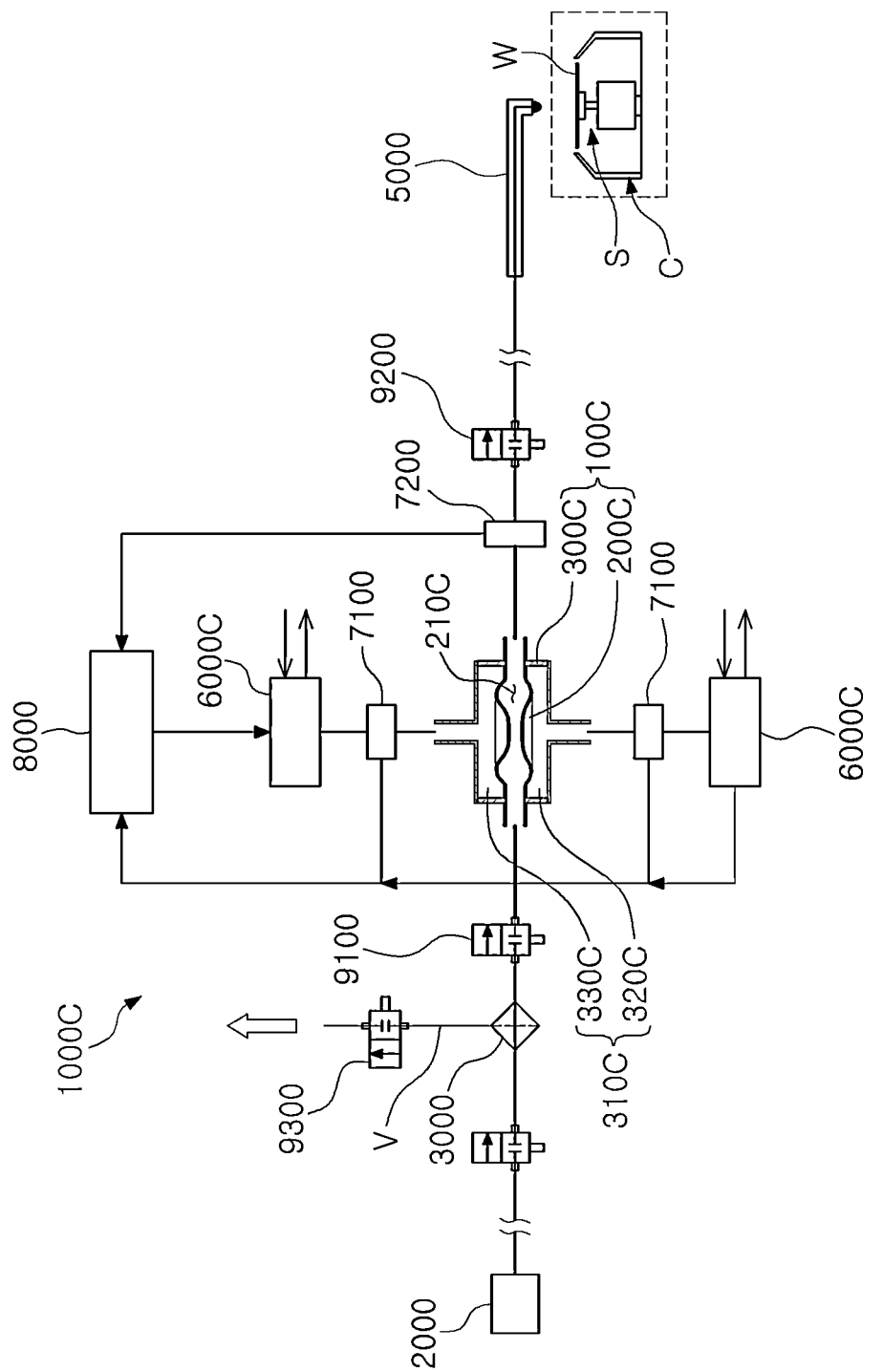
[FIG. 7]

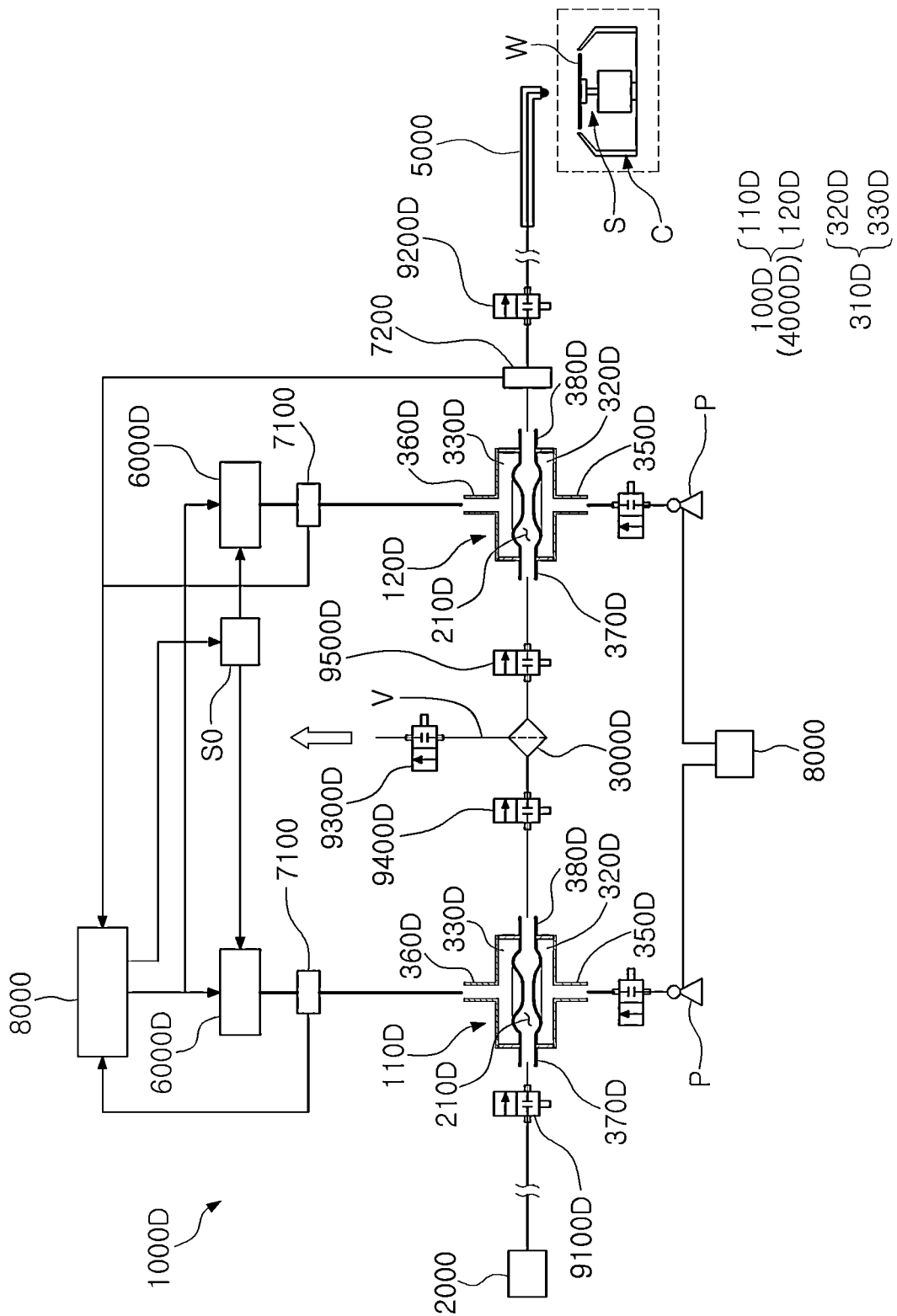
[FIG. 8]

[FIG. 9]
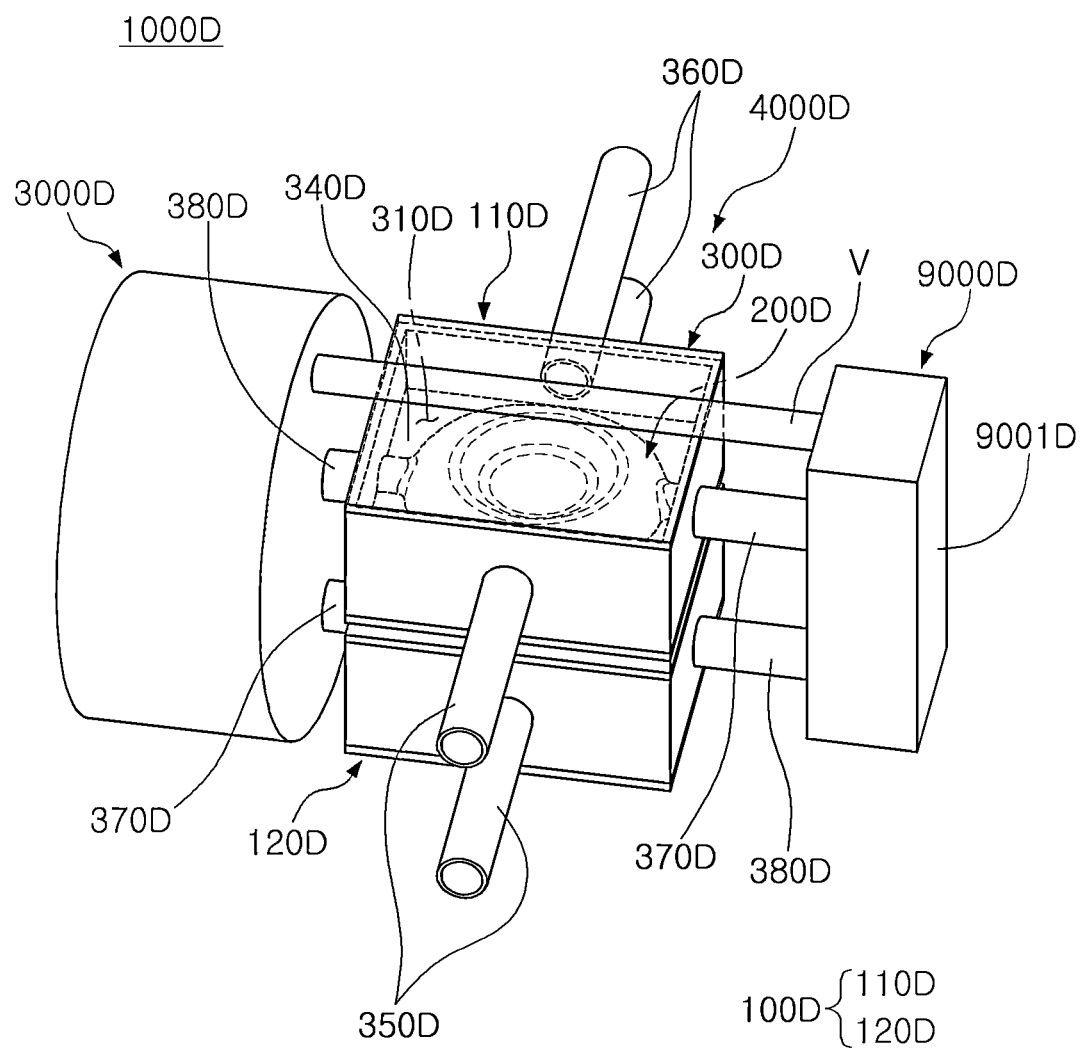

PUMP, APPARATUS FOR SUPPLYING CHEMICAL LIQUID AND APPARATUS FOR PROCESSING SUBSTRATE

CROSS-REFERENCE TO RELATED APPLICATIONS

The application claims benefit of priority to Korean Patent Application No. 10-2022-0041968 filed on Apr. 5, 2022 in the Korean Intellectual Property Office, the disclosure of which is incorporated herein by reference in its entirety.

BACKGROUND

1. Field

Example embodiments of the present disclosure relate to a pump, an apparatus for supplying a chemical liquid and an apparatus for processing a substrate.

2. Description of Related Art

Generally, a substrate may be manufactured through a deposition process, an etching process, a photoetching process, and a cleaning process in a process of manufacturing a semiconductor. For example, in a photoetching process, a photoetching treatment process may be performed by spraying various kinds of chemical liquids onto a substrate using an apparatus for supplying a chemical liquid. Such an apparatus for supplying a chemical liquid may include a pump disposed between a chemical liquid supply unit for supplying a chemical liquid and a nozzle portion for spraying the chemical liquid, and providing a discharge pressure to the nozzle portion.

In an apparatus for supplying a chemical liquid for discharging a chemical liquid to a substrate, a precise control and efficiency of discharge pressure may be required in relation to a pump.

SUMMARY

An example embodiment of the present disclosure is to provide a pump which may implement precise control of discharge pressure of chemical liquid, an apparatus for supplying a chemical liquid and an apparatus for processing a substrate.

According to an example embodiment of the present disclosure, a pump includes a tube having elasticity and having a flow path through which a chemical liquid flows in; and a case having an internal space partitioned into at least two chambers through which gas is supplied or discharged, where the at least two chambers cover an outer circumference of the tube.

The internal space of the case may be partitioned into a first chamber and a second chamber by a partition wall connecting the tube to an internal side surface of the case, and the first chamber and the second chamber may be configured to selectively form one of a vacuum state in which gas is discharged and a pressurized state in which gas is supplied.

A gas discharge unit connected to the first chamber and discharging gas to form the vacuum state and a gas supply unit connected to the second chamber and supplying gas to form the pressurized state may be disposed in the case.

The tube may have a toroid shape in which central portions of both side surfaces are inwardly recessed toward the flow path.

The pump may further include a protective unit covering an outer circumference of the tube between the tube and the case and having elasticity.

The protective unit may include a protective wall surrounding an outer circumferential surface of the tube with a space and a protective layer filling the space between the tube and the protective wall. The protective layer is formed of chemical liquid or gas.

According to another example embodiment of the present disclosure, an apparatus for supplying a chemical liquid includes a chemical liquid supply unit for supplying a chemical liquid; a filter unit connected to the chemical liquid supply unit and filtering a chemical liquid; a pump device connected to the filter unit and pumping a chemical liquid; and a nozzle portion connected to a downstream side of the pump device and discharging a chemical liquid, wherein the pump device includes: a tube having a flow path through which liquid flows in and having elasticity; and a case having an internal space divided into at least two chambers through which gas is supplied or discharged, where the at least two chambers cover an outer circumference of the tube.

The pump device may include a first pump connected between a downstream side of the liquid supply unit and an upstream side of the filter unit as the pump and a second pump connected between a downstream side of the filter unit and an upstream side of the nozzle portion; and an inlet valve disposed on an upstream side of the first pump, a first valve disposed between a downstream side of the first pump and an upstream side of the filter unit, a second valve disposed between an upstream side of the second pump and a downstream side of the filter unit, and a valve portion including an outlet valve disposed on a downstream side of the second pump.

According to another example embodiment of the present disclosure, an apparatus for processing a substrate includes a processing container having a space for processing a substrate therein; a substrate support member disposed in the processing container and supporting a substrate; a liquid supply unit for supplying a liquid; a filter unit connected to the liquid supply unit and filtering a liquid; a pump connected to the filter unit and pumping a liquid; and a nozzle portion connected to a downstream side of the pump and discharging a liquid to the substrate, wherein the pump includes a tube having a flow path through which the liquid flows in, having elasticity, and having a toroid shape in which central portions of both side surfaces are inwardly recessed toward the flow path; and a case having an internal space divided into a first chamber in which gas is discharged to form a vacuum state and a second chamber in which gas is supplied to form a pressurized state by a partition wall connecting the tube to the internal surface, where the first chamber and the second chamber cover an outer circumference of the tube.

BRIEF DESCRIPTION OF DRAWINGS

The above and other aspects, features, and advantages of the present disclosure will be more clearly understood from the following detailed description, taken in conjunction with the accompanying drawings, in which:

FIG. 1 is a diagram illustrating a diagram illustrating a flow path of an apparatus for supplying chemical liquid in an apparatus for processing a substrate according to an example embodiment of the present disclosure;

FIG. 2 is a diagram illustrating a structural of a pump applied to an apparatus for supplying a chemical liquid of an apparatus for processing a substrate according to an example embodiment of the present disclosure;

FIG. 3 is a cross-sectional perspective diagram illustrating a portion of a pump applied to an apparatus for supplying a chemical liquid of an apparatus for processing a substrate according to an example embodiment of the present disclosure;

FIG. 4 is a cross-sectional diagram illustrating a pump applied to an apparatus for supplying a chemical liquid of an apparatus for processing a substrate according to an example embodiment of the present disclosure, viewed in a length direction;

FIG. 5 is a cross-sectional diagram illustrating a pump applied to an apparatus for supplying a chemical liquid of an apparatus for processing a substrate according to another example embodiment of the present disclosure, viewed in a length direction;

FIG. 6 is a cross-sectional diagram illustrating a pump applied to an apparatus for supplying a chemical liquid of an apparatus for processing a substrate according to another example embodiment of the present disclosure;

FIG. 7 is a diagram illustrating a flow path of an apparatus for supplying a chemical liquid in an apparatus for processing a substrate according to another example embodiment of the present disclosure;

FIG. 8 is a diagram illustrating a flow path of an apparatus for supplying a chemical liquid in an apparatus for processing a substrate according to another example embodiment of the present disclosure; and FIG. 9 is a diagram illustrating an arrangement structure of a valve box including a pump device, a filter unit, and a plurality of valves applied to the apparatus for supplying a chemical liquid in FIG. 8 according to an example embodiment of the present disclosure.

DETAILED DESCRIPTION

Hereinafter, example embodiments of the present disclosure will be described as below with reference to the attached drawings.

In the drawings, same elements will be indicated by same reference numerals. Also, redundant descriptions and detailed descriptions of known functions and elements that may unnecessarily make the gist of the present disclosure obscure will not be provided. In the accompanying drawings, some elements may be exaggerated, omitted or briefly illustrated, and the sizes of the elements do not necessarily reflect the actual sizes of these elements. Also, the terms "upper," "upper portion," "upper surface," "lower," "lower portion," "lower surface," "side surface" are based on the drawings, and may be varied in a direction in which the components are disposed.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." The terms, "include," "comprise," "is configured to," or the like of the description are used to indicate the presence of features, numbers, steps, operations, elements, portions or combination thereof, and do not exclude the possibilities of combination or addition of one or more features, numbers, steps, operations, elements, portions or combination thereof.

An apparatus for processing a substrate in the example embodiment may be an apparatus for processing a substrate, and may be used in various processes such as an etching process, a photo process, and a cleaning process. For example, the apparatus for processing a substrate in the example embodiment may be used in an etching process, and specifically, the apparatus for processing a substrate may process substrate by supplying an etchant to the substrate using a chemical liquid supply unit, and may also be used for other substrate processing processes such as a photoetching process and a cleaning process.

For example, the apparatus for processing a substrate in the example embodiment may be applied to a photoetching process, may precisely adjust the discharge pressure of a chemical liquid necessary for the photoetching process, for example, a resist chemical liquid, in real time through an apparatus for supplying a chemical liquid, and may spray a resist chemical liquid to the substrate with an appropriate discharge pressure, thereby performing a photoetching process. However, an example embodiment thereof is not limited thereto, and the apparatus for processing a substrate be applied to various processes for providing a chemical liquid, such as a deposition process, an etching process, and a cleaning process.

First Embodiment

Example Embodiment 1

FIG. 1 is a diagram illustrating a diagram illustrating a flow path of an apparatus for supplying a chemical liquid in an apparatus for processing a substrate according to an example embodiment.

Referring to FIG. 1, the apparatus for processing a substrate according to the example embodiment 1 may include a processing container C disposed in a sealed processing chamber and including a space for processing a substrate W therein, a substrate support member S disposed in the processing container C and supporting the substrate W and a liquid supply device 1000 for supplying liquid to the substrate W.

When the liquid is discharged from the liquid supply device 1000, the processing container C may receive liquid scattered from the substrate W and may discharge the liquid externally of the processing container C.

The substrate support member S may support the substrate W to rotate and vertically move in the processing container C, such that, during processing the substrate, the substrate support member S may process the substrate W by supplying liquid to the substrate W through the liquid supply device 1000 in a state in which the substrate W is rotated and supported.

The liquid supply device 1000 in the example embodiment may include a liquid supply unit 2000, a filter unit 3000, a pump unit 4000 and a nozzle portion 5000.

The liquid supply unit 2000 may supply liquid to be processed to the substrate W, and may be a tank or bottle, and the liquid supplied from the liquid supply unit 2000 may pass through the filter unit 3000 and may be pumped at a predetermined pressure through the pump device 4000, and may be discharged to the substrate W by the nozzle portion 5000

The filter unit 3000 may be a component for filtering liquid, and may filter and remove impurities present in the liquid, electric charges, or substances to be removed. Also, the filter unit 3000 may further perform a function of filtering air bubbles present in the liquid and discharging the bubbles externally.

Here, various components may be disposed in the connection line between the liquid supply unit 2000 and the filter unit 3000 if desired. For example, in the connection line between the liquid supply unit 2000 and the filter unit 3000, a trap tank for temporarily storing the liquid supplied from the liquid supply unit 2000 and discharging the liquid externally, and a bubble separation unit for separating air bubbles in the liquid. In the drawing, the filter unit 3000 may be disposed on the upstream side of the pump device 4000, but an example embodiment thereof is not limited thereto, and the filter unit 3000 may be disposed on the downstream side of the pump device, that is, the connection line between the pump device 4000 and the nozzle portion 5000.

The pump device 4000 may be connected to the filter unit 3000, may pump liquid at a predetermined pressure and may supply the liquid to the nozzle portion 5000.

In the example embodiment, the pump device 4000 may include a single pump 100, but may include a plurality of pumps 100 if desired, and the description thereof will be specifically described later in the embodiment 2.

The nozzle portion 5000 may be connected to the downstream side of the pump device 4000, may discharge liquid toward the substrate W and may perform various treatments on the substrate W.

Also, the liquid supply device 1000 may further include a regulator 6000 connected to a pipe between the pump 100 of the pump device 4000 and the gas supply source S0 for supplying gas to the pump 100, and may control the supply or discharge of gas into the pump device 4000 through the regulator 6000.

Here, the gas flowing into the pump 100 may be, for example, air or an inert gas having low chemical reactivity.

Also, the liquid supply device 1000 may include a first pressure sensor 7100 disposed in the pipe between the pump 100 and the regulator 6000 in the pump device 4000 and measuring pressure of gas in the pipe between the pump 100 and the regulator 6000. Also, the liquid supply device 1000 may include a second pressure sensor 7200 disposed on the downstream side (a pipe between the pump 100 and the nozzle portion 5000) of the pump 100 through which the liquid flows out with respect to the flow direction of the liquid in the pump device 4000 and measuring the pressure of the liquid on the downstream side of the pump 100 through which the liquid is discharged.

The liquid supply device 1000 may further include a controller 8000 electrically connected to the regulator 6000, the first pressure sensor 7100, and the second pressure sensor 7200.

The control unit 8000 may receive the pressure values measured by the first pressure sensor 7100 and the second pressure sensor 7200 and may control the gas supplied to or discharged from the pump 100, such that precise control and efficiency of the discharge pressure of the liquid discharged to the nozzle portion 5000 through the pump 100 may be secured more effectively.

Also, the liquid supply device 1000 may include a valve portion 9000. The valve portion 9000 may include an inlet valve 9100 and an outlet valve 9200. The inlet valve 9100 may be disposed on the inlet side of the pump 100. The outlet valve 9200 may be disposed on the outlet side of the pump 100.

The valve portion 9000 may further include an exhaust valve 9300 disposed on the vent line V connected to the filter unit 3000 to perform exhausting.

A specific configuration of the pump 100 applied to the liquid supply device 1000 will be described in the description below.

FIG. 2 is a diagram illustrating a structural of a pump applied to an apparatus for supplying a chemical liquid of an apparatus for processing a substrate according to an example embodiment. FIG. 3 is a cross-sectional perspective diagram illustrating a portion of a pump applied to an apparatus for supplying a chemical liquid of an apparatus for processing a substrate according to an example embodiment. FIG. 4 is a cross-sectional diagram illustrating a pump applied to an apparatus for supplying a chemical liquid of an apparatus for processing a substrate according to an example embodiment, viewed in a length direction.

Referring to FIGS. 1 to 4, the pump 100 applied to the liquid supply device 1000 in the example embodiment may include a tube 200 and a case 300.

The tube 200 may have a flow path 210 through which the liquid flows, and may have elasticity such that a cross-sectional area of the flow path 210 may be changed. That is, the tube 200 may be formed of a material having a predetermined degree of elasticity such that the cross-sectional area of the flow path 210 may change when external pressure is applied or the cross-sectional area of the flow path 210 may return to an original state thereof when external pressure is released.

The tube 200 may have a toroid shape in which central portions of both sides are recessed toward the flow path, which may be advantageous in deformation when pressure is applied from the outside. Here, the toroid shape may include a hollow toroid (ring) shape with a central portion penetrated, and may also include the configuration in which the central portion may be recessed inwardly without being penetrated such that the liquid flows, and the overall outer shape of the tube may be an almost toroid shape.

The case 300 may form an outer shape of the pump 100 and the internal space may be divided into two chambers 310 in which gas is supplied or discharged. The two chambers 310 of the case 300 may cover the outer circumference of the tube 200. Accordingly, by an operation in which gas is supplied to or discharged from each chamber 310 within the case 300, by applying or releasing pressure to each corresponding outer circumferential surface of the tube 200 independently without interfering between internal pressure between the chambers 310, an efficient pumping operation of the pump 100 may be obtained, and precise control of liquid discharge pressure may be implemented.

Here, when the case 300 is divided into two chambers 310, for example, the internal space of the case 300 may be partitioned into a first chamber 320 and a second chamber 330 by a partition wall 340 connecting the internal side surfaces of the tube 200 and the case 300.

Also, in the case 300, a liquid inlet 370 and a liquid outlet 380 connected to the inlet 371 and outlet 381 of the flow path 210 of the tube 200 and disposed on the same linear line as the inlet 371 and outlet 381 may be disposed. In this case, the liquid inlet 370 and the liquid outlet 380 of the case 300 may be disposed on the partition wall 340 and may be connected to the inlet and outlet of the flow path 210 of the tube 200.

Accordingly, by connecting the liquid inlet 370 to the liquid outlet 380 disposed in the case 300 of the pump 100 in an appropriate position on the flow path of the liquid supply device 1000, easy assembly and maintenance may be implemented.

Also, a gas discharge unit 350 and a gas supply unit 360 may be disposed in the case 300. The gas discharge unit 350 may be connected to the first chamber 320 and may discharge gas to form the vacuum state. The gas supply unit 360 may be connected to the second chamber 330 and may supply gas to form the pressurized state.

Here, as a specific example, as illustrated in FIG. 1, the gas discharge unit 350 may be connected to the vacuum pump P, may discharge the gas in the first chamber 320, and may form a vacuum state. The gas supply unit 360 may be connected to the gas supply source S0, may supply gas into the second chamber 330 and may form a pressurized state. Accordingly, the first chamber 320 may form a vacuum state, and the second chamber 330 may form a pressurized state around the partition wall 340 connecting the internal side surfaces of the tube 200 and the case 300 such that the shape of the tube 200 may be changed, and accordingly, the liquid in the flow path 210 of the tube 200 may be pumped, and further, the discharge pressure of the liquid may be finely adjusted, such that precise control may be implemented. Further, the above-described regulator 6000 may be disposed in the connection line between the gas supply unit 360 and the gas supply source S0, may control the supply or discharge of gas into the second chamber 330 through the regulator 6000 and may control the internal pressure of the second chamber 330.

In the structure in which the tube 200 forms a toroid shape, the gas discharge portion 350 may be disposed on the first sidewall 301 opposite to one side surface of the tube 200 facing the first chamber 320 in the case 300, may be connected to the first chamber 320 and may discharge gas to form the vacuum state, and the gas supply unit 360 may be disposed on the second side wall 302 opposite to the other side surface of the tube 200 toward the second chamber 330 in the case 300, may be connected to the second chamber 330, and may supply gas to form the pressurized state.

Here, the operation of the pump 100 may be implemented in various forms if desired. For example, the gas in the first chamber 320 may be discharged through the vacuum pump P and may maintain a vacuum state, pumping may be performed by adjusting the pressure applied to the outer circumferential surface of the tube 200 by controlling the supply of gas into the second chamber 330, and further, Precise control of the discharge pressure of the liquid in the flow path 210 of the tube 200 may be implemented. That is, the pump 100 may finely adjust the discharge pressure of the pump 100 by forming a vacuum in the first chamber 320 and supplying gas to the second chamber 330, and may also implement precise control of discharge pressure of liquid may be implemented in real time.

As another example, in a pressurized state in which a constant pressure is applied by supplying gas into the second chamber 330 from the gas supply source S0, by adjusting the pressure applied to the outer circumferential surface of the tube 200 by adjusting the discharge of the gas in the first chamber 320 by the vacuum pump P, the liquid in the flow path 210 of the tube 200 may be pumped, and further, precise control of the discharge pressure of the liquid in the flow path 210 of the tube 200 may be implemented.

As another example, pressures in the first chamber 320 and the second chamber 330 may be simultaneously adjusted.

As described above, the liquid supply device 1000 according to the example embodiment 1 may, by the operation of supplying gas to or discharging gas from the first chamber 320 and the second chamber 330 through the pump 100 having the above configuration 330, by applying or releasing pressure to each corresponding outer circumferential surface of the tube 200 independently without interfering between internal pressure of the first chamber 320 and the second chamber 330, efficient pumping operation of the pump 100 may be secured, and further, precise control may be implemented by finely adjusting the discharge pressure of the liquid.

In the aforementioned example embodiment, the control unit may be included in the liquid supply device, but an example embodiment thereof is not limited thereto, and the control unit may not be included in the liquid supply device and may be installed in an appropriate position of the apparatus for processing a substrate including the liquid supply device, may receive related data obtained through the liquid supply device and may control related components.

Example Embodiment 2

FIG. 5 is a cross-sectional diagram illustrating a pump applied to an apparatus for supplying a chemical liquid of an apparatus for processing a substrate according to another example embodiment, viewed in a length direction.

The pump 100A according to the example embodiment 2 will be described with reference to FIG. 5.

Referring to FIG. 5, the pump 100A according to the example embodiment 2 may include a tube 200A, a case 300A and a protective unit 400A. In the example embodiment 2, the components other than the protective unit 400A may be applied in the same manner as those of example embodiment 1, and detailed descriptions of the same components will not be provided.

The protective unit 400A may cover the outer circumference of the tube 200A between the tube 200A and the case 300A in the pump 100A, and may have elasticity such that the protective unit 400A may be deformed by the internal pressure of the first chamber 320A and the second chamber 330A in the case 300A and the pressure may be applied to or released from the outer circumferential surface of the tube 200A.

The protective unit 400A may be implemented in various forms, and as a specific example, the protective unit 400A may include a protective wall 410A and a protective layer 420A filled in the protective wall 410A.

The protective wall 410A of the protective unit 400A may be disposed in the case 300A and may be disposed surrounding the outer circumferential surface of the tube 200A with a space.

The protective layer 420A of the protective unit 400A may be formed of a liquid or gas filled in a space between the outer circumferential surface of the tube 200A and the protective wall 410A.

Accordingly, by including the protective unit 400A including the protective wall 410A and the protective layer 420A formed of liquid or gas, rapid pressure change due to the pressure spraying into the chamber 310A (first chamber 320A) of the case 300A may be prevented, moisture penetration into the case may be prevented, and the temperature of the liquid in the flow path 210A of the tube 200A may be implemented.

In the example embodiment, the configuration of the protective unit 400A including the protective wall 410A and the protective layer 420A has been described as an example, but an example embodiment thereof is not limited thereto, and the protective unit may be implemented in various forms as long as the protective unit may implement at least one of the effects of rapid pressure change, prevention of water penetration, and liquid temperature maintenance. As a modified example, the protective unit may be implemented as a silicon member having a single-layer structure.

Meanwhile, in example embodiment 1 and example embodiment 2 above, a vacuum state may be formed in the first chamber and a pressurized state may be formed in the second chamber, but an example embodiment thereof is not limited thereto, and the first chamber and the second chamber may be configured to selectively form one of a vacuum state in which gas is discharged and a pressurized state in which gas is supplied. For example, a pressurized state may be formed in the first chamber by switching the functions of the first chamber and the second chamber, and the vacuum state may be formed in the second chamber, and also, both the first chamber and the second chamber may be implemented in a configuration for supplying and discharging gas, such that the effect in which the gas may be selectively supplied or discharged may be obtained.

Also, in example embodiment 1 and example embodiment 2, the example in which the internal space of the case may be partitioned into two chambers has been described, but an example embodiment thereof is not limited thereto, and two or more chambers may be provided if desired.

The example in which the internal space is divided into three chambers will be described as an example in the description below.

Example Embodiment 3

FIG. 6 is a cross-sectional diagram illustrating a pump applied to an apparatus for supplying a chemical liquid of an apparatus for processing a substrate according to example embodiment 3.

The pump 100B according to the example embodiment 3 will be described with reference to FIG. 6.

Referring to FIG. 6, the pump 100B according to the example embodiment 3 may include a tube 200B and a case 300B. In the example embodiment 3, the components other than the pump 100B including the tube 200B and the case 300B may be the same as the components in the example embodiment 1, and the detailed description of the same components will not be provided.

As illustrated in FIG. 6, the pump 100B according to the example embodiment 3 may include a case 300B including three chambers 310B.

Specifically, the internal space of the case 300B may be partitioned into three chambers 310B by a partition wall 340B connecting the internal side surface of the tube 200B to the case 300B.

In this case, a recessed groove 220B forming a recessed shape toward the flow path 210B of each tube 200B may be formed in the outer circumferential surface of the tube 200B corresponding to each chamber 310B such that the tube 200B may be easily deformed by the internal pressure of each chamber 310B.

Also, the tube 200B may have a symmetrical shape with respect to the center, and in this case, each chamber 310B of the case 300B may be partitioned into the same size by the partition wall 340B.

Accordingly, as pressure is applied or released to each recessed groove 220B formed on the outer circumferential surface of the tube 200B through supplying or discharging gas to each chamber 310B, as pressure is applied or released to each recessed groove 220B formed in the outer circumferential surface of the tube 200B, the tube 220B may be easily deformed, such that an efficient pumping operation of the pump 100B may be secured, and further, since the supply or discharge of gas in each of the three chambers 310B may be adjusted in various manners if desired, such that precise control of the discharge pressure of the liquid may be implemented effectively.

FIG. 7 is a diagram illustrating a flow path of an apparatus for supplying a chemical liquid in an apparatus for processing a substrate according to another example embodiment.

A liquid supply device 1000C according to an example embodiment 4 will be described with reference to FIG. 7.

Referring to FIG. 7, in the liquid supply device 1000C according to the example embodiment 4, a gas supply source S0 may be connected to each of the first chamber 320C and the second chamber 330C of the case 300C in the pump 100C, and gas may be independently supplied to or discharged from the first chamber 320C and the second chamber 330C.

Further, the above-described regulator 6000C may be disposed in the connection line between the first chamber 320C and the second chamber 330C of each case 300C, the supply or discharge of gas into the first chamber 320C and the second chamber 330C may be adjusted through the regulator 6000C, thereby controlling internal pressures of the first chamber 320C and the second chamber 330C.

Accordingly, by controlling the internal pressures of the first chamber 320C and the second chamber 330C applied to the outer circumferential surface of the tube 200C by independently controlling the supply or discharge of gas for the first chamber 320C and the second chamber 330C partitioned from each other by the partition wall connecting the internal side surface of the tube 200C and the case 300C, the shape of the tube 200C may be deformed, such that the liquid in the flow path 210C of the tube 200C may be pumped, and further, the discharge pressure of the liquid may be finely adjusted, such that precise control may be implemented.

In the liquid supply device 1000C according to an example embodiment, the pump 100C may be applied in the same manner as the pumps 100, 100A, and 100B applied to the above example embodiments 1 to 3, the detailed description of the same components will not be provided.

In the example embodiments 1 to 4, the example in which two chambers are partitioned by a partition wall disposed in the case has been described, but an example embodiment thereof is not limited thereto, and the space may be partitioned into a plurality of chambers by other components. Also, the internal space of the case may be directly divided into a plurality of chambers by the tube, and specifically, the internal space of the case may be divided into a plurality of chambers by a structure in contact with the protruding portion of the tube and the structure in contact with the internal side wall of the case.

Second Embodiment

Example Embodiment 4

FIG. 8 is a diagram illustrating a flow path of an apparatus for supplying a chemical liquid in an apparatus for processing a substrate according to example embodiment 5. FIG. 9 is a diagram illustrating an arrangement structure of a valve box including a pump device, a filter unit, and a plurality of valves applied to the apparatus for supplying a chemical liquid in FIG. 8 according to an example embodiment.

A liquid supply device according to an example embodiment 5 will be described with reference to FIGS. 8 and 9.

Referring to FIGS. 8 and 9, the liquid supply device 1000D according to the example embodiment 5 may include a liquid supply unit 2000 for supplying liquid, and a filter connected to the liquid supply unit 2000 and filtering the liquid, a pump unit 4000D connected to the filter unit 3000D and pumping liquid, and a nozzle portion 5000 connected to the downstream side of the pump unit 4000D and discharging the liquid.

In the example embodiment, the components other than the pump device 4000D may be applied identically to the components of the example embodiments 1 to 4, and descriptions of the same components will not be provided.

The pump device 4000D according to the example embodiment 5 may include two pumps 100D including a first pump 110D and a second pump 120D. Each of the first pump 110D and the second pump 120D may include a tube 200D having elasticity and forming a flow path 210D through which liquid flows, and a case 300D in which the internal space is divided into at least two chambers 310D through which gas is supplied or discharged, where the at least two chambers 310D may cover the outer circumference of the tube 200D.

In the example embodiment, the configuration of a case partitioned into two chambers 310D will be described as a specific example.

The tubes 200D of the first pump 110D and the second pump 120D may be formed in a toroid shape in which central portions of both sides may be recessed toward the flow path, which may be advantageous in deformation when pressure is applied from the outside. Here, the toroid shape may include the configuration in which the central portion may be recessed inwardly without being penetrated such that the liquid flows, and the overall outer shape of the tube may be an almost toroid shape.

The case 300D may form an outer shape of the first pump 110D and the second pump 120D, and the internal space thereof may be divided into two chambers 310D in which gas is supplied or discharged. The two chambers 310D of the case 300D may cover the outer circumference of the tube 200D. Accordingly, by the operation of supplying gas to or discharging gas from the chambers 310D, by applying or releasing pressure to each corresponding outer circumferential surface of the tube 200D independently without interfering between the internal pressures of the chambers 310D, efficient pumping operation of the first pump 110D and the second pump 120D may be secured, and further, precise control of the liquid discharge pressure may be implemented.

Here, when the case of the case 300D is divided into two chambers 310D, for example, the internal space of the case 300D may be divided into a first chamber 320D and a second chamber 330D by a partition wall 340D connecting the internal side surfaces of the tube 200D and the case 300D.

Also, the case 300D may include a liquid inlet 370D and a liquid outlet 380D connected to the inlet and outlet of the flow path 210D of the tube 200D and disposed on the same linear line as the inlet and outlet. In this case, the liquid inlet 370D and liquid outlet 380D of the case 300D may be disposed on the partition wall 340D and may be connected to the inlet and outlet of the flow path 210D of the tube 200D.

Accordingly, by connecting the liquid inlet 370D and the liquid outlet 380D disposed in the case 300D of the first pump 110D and the second pump 120D in appropriate positions on the flow path of the liquid supply device 1000D, easy assembly and maintenance may be implemented.

Also, a gas discharge unit 350D and a gas supply unit 360D may be disposed in the case 300D. The gas discharge unit 350D may be connected to the first chamber 320D and may discharge gas to form the vacuum state. The gas supply unit 360D may be connected to the second chamber 330D and may supply gas to form the pressurized state.

Here, as a specific example, as illustrated in FIG. 8, the gas exhaust unit 350D may be connected to the vacuum pump P, may discharge the gas in the first chamber 320D and may form a vacuum state. The gas supply unit 360D may be connected to the gas supply source S0, may supply gas into the second chamber 330D and may form a pressurized state. Accordingly, the first chamber 320D may form a vacuum state and the second chamber 330D may form a pressurized state around the partition wall 340D connecting the internal side surface of the tube 200D and the case 300D, such that the shape of the tube 200D may be deformed such that the liquid in the flow path 210D of the tube 200D may be pumped, and further, the discharge pressure of the liquid may be finely adjusted such that precise control may be implemented. Further, the above-described regulator 6000D may be disposed in the connection line between the gas supply unit 360D and the gas supply source S0 and may control the supply or discharge of gas into the second chamber 330D through the regulator 6000D, the internal pressure of the second chamber 330D may be controlled.

Here, the operations of the first pump 110D and the second pump 120D may be implemented in various forms if desired, and for example, by maintaining a vacuum state by discharging the gas in the first chamber 320D by the vacuum pump P, and by adjusting the pressure applied to the outer circumferential surface of the tube 200D controlling the supply of gas into the second chamber 330D, the pumping may be performed, and further precise control of the discharge pressure of the liquid in the flow path 210D may be implemented. That is, the pump 100D may form a vacuum in the first chamber 320D and may supply gas to the second chamber 330D, thereby finely adjusting the discharge pressure of the first pump 110D and the second pump 120D, and precise control of the discharge pressure of the liquid may be implemented in real time.

As another example, in a pressurized state in which a predetermined pressure is applied by supplying gas into the second chamber 330D from the gas supply source S0, by adjusting the pressure applied to the outer circumferential surface of the tube 200D by adjusting the discharge of gas in the first chamber 320D by the vacuum pump P, the liquid in the flow path 210D of the tube 200D may be pumped, and further, precise control of the discharge pressure of the liquid in the flow path 210D of the tube 200D may be implemented.

As another example, pressures in the first chamber 320D and the second chamber 330D may be simultaneously adjusted.

As described above, in the liquid supply device 1000D according to the example embodiment 5, By the operation in which gas is supplied to or discharged from the first chamber 320D and the second chamber 330D within the case 300D through the first pump 110D and the second pump 120D having the above configuration, by applying or releasing pressure to the corresponding outer circumferential surfaces of the tube 200D independently without interfering between the internal pressures between the first chamber 320D and the second chamber 330D, the efficient pumping operation of the pump 100D may be secured, and further, precise control may be implemented by finely adjusting the discharge pressure of the liquid.

Here, the configuration of one of the pumps 100, 100A, 100B, and 100C of the example embodiments 1 to 4 of the first embodiment may be applied to the first pump 110D and the second pump 120D. Here, the detailed description thereof will not be provided.

The first pump 110D may be connected between the downstream side of the liquid supply unit 2000 and the upstream side of the filter unit 3000D and may be used as a supply pump for temporarily storing the liquid supplied from the liquid supply unit 2000. The second pump 120D may be used as a distribution pump which may be connected between the downstream side of the filter unit 3000D and the upstream side of the nozzle portion 5000, may receive the liquid stored in the first pump 110D, and may discharges the liquid to the substrate W by the nozzle portion 5000 by pumping the liquid through the pump 120D.

Also, the liquid supply device 1000D may include a valve portion 9000D. The valve portion 9000D may include an inlet valve 9100D, a first valve 9400D, a second valve 9500D, and an outlet valve 9200D. The valve portion 9000D may further include an exhaust valve 9300D disposed in the vent line V connected to the filter unit 3000D to perform exhausting. The inlet valve 9100D, the first valve 9400D, the second valve 9500D, the outlet valve 9200D, and the exhaust valve 9300D may be integrated into the valve box 9001D of the valve portion 9000D. The inlet valve 9100D may be disposed on the upstream side of the first pump 110D. The first valve 9400D may be disposed between the downstream side of the first pump 110D and the upstream side of the filter unit 3000D. The second valve 9500D may be disposed between the upstream side of the second pump 120D and the downstream side of the filter unit 3000D. The outlet valve 9200D may be disposed on the downstream side of the second pump 120D.

Further, the first pump 110D and the second pump 120D may be disposed side by side between the filter unit 3000D and the valve box 9001D of the valve portion 9000D, such that a compact arrangement structure between the pump unit 4000D, the filter unit 3000D, and the valve unit 9000D may be implemented, usability may be increased in a limited arrangement space.

Operations of the first pump 110D and the second pump 120D will be described in the description below.

When the liquid is supplied to the first pump 110D, the inlet valve 9100D may be opened and the liquid may be supplied from the liquid supply unit 2000 into the flow path 210D of the tube 200D of the first pump 110D. When a sufficient amount of liquid is supplied into the flow path 210D of the tube 200D of the first pump 110D, the inlet valve 9100D may be closed. The first valve 9400D and the second valve 9500D may be opened, gas may be supplied to the second chamber 330D of the first pump 110D, a pressurized state (here, the vacuum pump P is selectively operated to allow the first chamber 320D to form a vacuum state) may be formed, and pressure may be applied to the outer circumferential surface of the tube 200D, such that the liquid in the flow path 210D of the tube 200D may pass through the filter unit 3000D and may flow into the flow path 210D of the tube 200D of the second pump 120D. Here, when the first valve 9400D and the second valve 9500D are opened, the first valve 9400D may be first opened to increase the pressure in the filter unit 3000D, and the second valve 9500D may be opened to allow liquid to flow into the flow path 210D of the tube 200D of the second pump 120D. Also, by adjusting the internal pressure of the first chamber 320D or the second chamber 330D of the first pump 110D by simultaneously opening the first valve 9400D and the second valve 9500D, the pressure on the filter unit 3000D side may be increased and the liquid may flow through the filter unit 3000D and may flow into the flow path 210D of the tube 200D of the second pump 120D.

Also, when exhausting through the filter unit 3000D, by applying the pressure to the outer circumferential surface of the tube 200D of the first pump 110D by opening the first valve 9400D the exhaust valve 9300D, air bubbles in the liquid may be exhausted through the vent line V. Here, in the process of exhausting, the second valve 9500D may be selectively opened or closed.

When liquid in the flow path 210D of the tube 200D of the second pump 120D is to be discharged through the nozzle portion 5000, by forming the pressurized state by closing the inlet valve 9100D, opening the outlet valve 9200D, and supplying the gas to the second chamber 330D of the second pump 120D, pressure may be applied to the outer circumferential surface of the tube 200D, such that the liquid in the flow path 210D of the tube 200D of the second pump 120D may be discharged to the substrate W through the nozzle portion 5000.

Accordingly, by including the pump device 4000D including the first pump 110D and the second pump 120D, the liquid supplied into the flow path of the tube 200D of the first pump 110D may be swiftly supplied to the supplied into the passage of the tube 200D of the second pump 120D compared to the liquid application time in the nozzle portion, and the liquid may be continuously supplied to the substrate, such that the work efficiency may be effectively improved.

In example embodiment 5 of the embodiment 2, it has been described that the configuration of the pump of the example embodiment 1 is applied, but an example embodiment thereof is not limited thereto, and the configuration of the pump described in the example embodiments 2 to 4 of the first embodiment may be applied.

Also, the first pump and the second pump may have the same configuration in the example embodiment, the first pump and the second pump may have different configurations, and may be one of the pump described with reference to the example embodiments 1 to 4. Also, an existing pump may be used as one of the first pump.

According to an example embodiment, using the pump, the apparatus for supplying a chemical liquid and the apparatus for processing a substrate, by an operation in which gas is supplied or discharged into each partitioned chamber in the case, by applying or releasing pressure to the outer circumference of each corresponding tube independently without interfering between the internal pressures between the chambers, efficient pumping operation of the pump may be obtained, and precise control of the discharge pressure of the liquid may be implemented.

While the example embodiments have been illustrated and described above, it will be apparent to those skilled in the art that modifications and variations could be made without departing from the scope of the present disclosure as defined by the appended claims.

What is claimed is:
1. A pump, comprising:
a tube having elasticity and having a flow path through which a chemical liquid flows in, wherein the tube has a toroid shape having central portions inwardly recessed toward the flow path and peripheral ring portions circularly surrounding the central portions and outwardly protruding away from the flow path; and
a case having an internal space partitioned into at least two chambers through which gas is supplied or discharged, where the at least two chambers cover an outer circumference of the tube.

2. The pump of claim 1,
wherein the internal space of the case is partitioned into a first chamber and a second chamber by a partition wall connecting the tube to an internal side surface of the case, and
wherein the first chamber and the second chamber are configured to selectively form one of a vacuum state in which gas is discharged and a pressurized state in which gas is supplied.

3. The pump of claim 2, wherein a gas discharge unit connected to the first chamber and discharging gas to form the vacuum state and a gas supply unit connected to the second chamber and supplying gas to form the pressurized state are disposed in the case.

4. The pump of claim 2,
wherein a gas outlet connected to the first chamber and discharging gas to form the vacuum state is disposed on a first sidewall opposite to one side surface of the tube facing the first chamber in the case, and
wherein a gas supply unit connected to the second chamber and supplying gas to form the pressurized state is disposed on a second sidewall opposite to the other side surface of the tube facing the second chamber in the case.

5. The pump of claim 2, wherein a chemical liquid inlet and a chemical liquid outlet connected to an inlet and an outlet of the flow path of the tube and disposed on the same linear line as the inlet and outlet are disposed in the case.

6. The pump of claim 1, wherein the tube has a shape symmetrical about a center, and each chamber has the same size.

7. The pump of claim 1, further comprising:
a protective unit covering an outer circumference of the tube between the tube and the case and having elasticity.

8. The pump of claim 7, wherein the protective unit includes a protective wall surrounding an outer circumferential surface of the tube with a space and a protective layer filling the space between the tube and the protective wall.

9. The pump of claim 8, wherein the protective layer is formed of chemical liquid or gas.

10. An apparatus comprising:
a chemical liquid supply unit for supplying a chemical liquid;
a filter unit connected to the chemical liquid supply unit and filtering the chemical liquid;
a pump device connected to the filter unit and pumping the chemical liquid; and
a nozzle portion connected to a downstream side of the pump device and discharging the chemical liquid,
wherein the pump device includes: a tube having a flow path through which the chemical liquid flows in and having elasticity, wherein the tube has a toroid shape having central portions inwardly recessed toward the flow path and peripheral ring portions circularly surrounding the central portions and outwardly protruding away from the flow path; and
a case having an internal space divided into at least two chambers through which gas is supplied or discharged, where the at least two chambers cover an outer circumference of the tube.

11. The apparatus of claim 10, wherein the pump device includes:
a first pump connected between a downstream side of the liquid supply unit and an upstream side of the filter unit and a second pump connected between a downstream side of the filter unit and an upstream side of the nozzle portion; and
an inlet valve disposed on an upstream side of the first pump, a first valve disposed between a downstream side of the first pump and an upstream side of the filter unit, a second valve disposed between an upstream side of the second pump and a downstream side of the filter unit, and a valve portion including an outlet valve disposed on a downstream side of the second pump.

12. The apparatus of claim 11, wherein the first pump and the second pump are disposed side by side between the filter unit and a valve box of the valve portion.

13. The apparatus of claim 10,
wherein an internal space of the case is partitioned into a first chamber and a second chamber by a partition wall connecting the tube to the internal side surface of the case, and
wherein the first chamber and the second chamber are configured to selectively form one of a vacuum state in which gas is discharged and a pressurized state in which gas is supplied.

14. The apparatus of claim 13, wherein a gas discharge unit connected to the first chamber and discharging gas to form the vacuum state and a gas supply unit connected to the second chamber and supplying gas to form the pressurized state are disposed in the case.

15. The apparatus of claim 10, wherein a protective unit covering an outer circumference of the tube between the tube and the case and having elasticity.

16. The apparatus of claim 15, wherein the protective unit includes a protective wall surrounding an outer circumferential surface of the tube with a space and a protective layer filling the space between the tube and the protective wall.

17. An apparatus comprising:
a processing container having a space for processing a substrate therein;
a substrate support member disposed in the processing container and supporting a substrate;
a liquid supply unit for supplying a liquid;
a filter unit connected to the liquid supply unit and filtering the liquid;
a pump connected to the filter unit and pumping the liquid; and
a nozzle portion connected to a downstream side of the pump and discharging the liquid to the substrate,
wherein the pump includes:
a tube having a flow path through which the liquid flows in, and having elasticity; and
a case having an internal space partitioned into at least two chambers through which gas is supplied or discharged, where the at least two chambers cover an outer circumference of the tube, wherein the case is partitioned into three chambers by partition walls connecting the tube to an internal side surface of the case, and wherein an outer circumferential surface of the tube corresponding to each of the chambers includes a recess groove, recessed toward the flow path.

* * * * *